(12) United States Patent
Inori

(10) Patent No.: US 6,544,482 B1
(45) Date of Patent: Apr. 8, 2003

(54) CHAMBER CLEANING MECHANISM

(75) Inventor: David M. Inori, Napa, CA (US)

(73) Assignee: Advanced Technology Materials, Inc., Danbury, CT (US)

( * ) Notice: Subject to any disclaimer, the term of this patent is extended or adjusted under 35 U.S.C. 154(b) by 0 days.

(21) Appl. No.: 09/525,221

(22) Filed: Mar. 14, 2000

(51) Int. Cl.⁷ .................. B01D 53/34; B01D 53/74; F23J 3/02; B08B 9/027
(52) U.S. Cl. .................. 422/168; 422/170; 422/171; 422/178; 422/210; 15/104.068; 15/104.096; 15/104.09; 15/249.2
(58) Field of Search .................. 422/168–171, 422/177, 178, 210; 15/104.068, 104.096, 104.09, 249.2, 249.1

(56) References Cited

U.S. PATENT DOCUMENTS

| | | | |
|---|---|---|---|
| 548,138 A | 10/1895 | Prather | 15/246.5 |
| 851,134 A | 4/1907 | Kleidon | 15/249.2 |
| 1,082,766 A | 12/1913 | Reynolds | 55/296 |
| 1,261,243 A | 4/1918 | Kettner | 15/246.5 |
| 1,616,777 A | 2/1927 | Booth | 15/246.5 |
| 1,697,390 A | 1/1929 | Kipper | 423/482 |
| 2,114,553 A | 4/1938 | Woodford | 55/296 |
| 2,222,283 A | 11/1940 | Crowell | 549/262 |
| 2,554,546 A | 5/1951 | Zahm | 15/246.5 |
| 2,661,811 A | 12/1953 | Kautz | 55/282.1 |
| 3,120,020 A | 2/1964 | Schell | 15/249.2 |
| 3,550,177 A | 12/1970 | Darr et al. | 15/104.096 |
| 3,589,609 A | 6/1971 | Wyant | 15/249.2 |
| 4,067,814 A | 1/1978 | Surakka et al. | 55/459.4 |
| 4,210,976 A | 7/1980 | Apelt et al. | 15/246.5 |
| 4,372,761 A | 2/1983 | Lindroos | 96/368 |
| 5,207,991 A | 5/1993 | Gerking | 422/210 |

FOREIGN PATENT DOCUMENTS

JP 0032166 3/1979

*Primary Examiner*—Hien Tran
(74) *Attorney, Agent, or Firm*—William Ryann; Margaret Chappuis

(57) ABSTRACT

The present invention provides a reaction chamber cleaning apparatus comprising a chamber, a blade apparatus comprising at least one annular mounting member, at least four scraping blades attached peripherally about the annular mounting member, and a reciprocal movement unit for rotating said scraping blade(s) circumferentially back and forth along the interior surface of said chamber to scrape the interior surface of said chamber; said reaction chamber cleaning apparatus also comprising a vortex unit comprising a generally conical outer shell attached to and extending downwardly from the top plate top plate, and a liquid inlet arranged in relation to the outer shell to tangentially introduce liquid into the outer shell, thereby forming a laminar sheet of fluid on the inner surface of the outer shell; said vortex unit further comprising a baffle and a concentric chamber bounded by the outer surface of the baffle, the inner surface of the outer shell, and the bottom surface of the top plate. The invention also includes methods for using the reaction chamber for effluent abatement.

45 Claims, 10 Drawing Sheets

CHAMBER CLEANING MECHANISM

1. BACKGROUND OF THE INVENTION

The invention relates to a method and apparatus for cleaning a chamber.

Chemical vapor deposition (CVD) processes, such as organometallic chemical vapor deposition (OMCVD or MOCVD) processes, are commonly employed in the semiconductor, optical, and optoelectronic industries for doping or coating a substrate. Certain chemical vapor deposition processes, particularly those associated with large scale fabrication of epitaxial semiconductor devices, produce highly toxic effluent gases, such as dichlorosilane, trichlorosilane, phosphine, arsine, and hydrogen and nitrogen derivatives which have been generated in the fabrication reactor. These toxic gaseous effluents are frequently contain particulate or particle-forming components, e.g., silica particles, which must be removed before the gases can be further processed, diluted and/or neutralized, prior to ultimate discharge into the ambient environment.

Particulate-containing gaseous effluent is typically introduced into a scrubbing chamber through an inlet. The particulate matter is sticky in character and tends to adhere to the inner surface of the chamber. Various reaction chamber cleaning mechanisms (RCCMs) have been devised to prevent, or at least slow down, the buildup of particulate matter on the inner surfaces of the scrubbing chambers.

In currently available cleaning chambers, a spray jet is commonly employed to spray inside the bottom of the reaction chamber. This spray serves the dual purposes of quenching the hot gas flow and performing a water scrubbing function. A major drawback of such scrubbers is that the water spray can cause corrosion and buildup. There is a need in the art for an RCCM which provides an effective scrubbing mechanism without depending on water spray inside the reaction chamber for cooling. Such an RCCM would avoid the corrosion and buildup problems associated with presently available cleaning chambers.

RCCMs commonly use blade assemblies to scrape particulate matter from the interior surfaces of cleaning chambers. The RCCM blade assemblies of currently available RCCMs often lack sufficient strength to cut through the deposits formed on the reaction chamber wall. Such blade assemblies commonly become bent and/or twisted and thereafter permit buildup to form on the walls of the reaction chamber. There is a need in the art for an RCMM that overcomes these deficiencies in prior art blade assemblies.

Currently available RCCMs employ a push rod assembly drive mechanism to rotate the blade assembly about the inner surface of the cleaning chamber. These push rod assemblies are often not reliable, resulting in a low average service life for the cleaning chamber apparatus. The inventor has discovered that such push rod assemblies fail because the return spring becomes fatigued and fails to bend the push rod enough to engage it with the RCCM gear. The alignment key in the RCCM housing fails and causes the push rod assembly to rotate, thereby forcing the push rod to work at an angle that causes failure of the pivot pin. The alignment key and push rod assembly engagement surfaces are often damaged. The tip of the push rod assembly deforms permanently due to compressive stresses. The fasteners that attach the blade assembly to the drive mechanism often corrode and fail depending on exposure to corrosive gases. The bearings cold flow and loosen up over time, allowing water to teak into the housing. The RCCMs have no means of adjusting for manufacturing tolerance build up. Occasionally, the Teflon bearings are too tight, preventing the RCCM gear from turning. There is no indicator to monitor the functioning of the RCCM. There is therefore a need in the art for an RCCM apparatus which overcomes all of these difficulties.

2. SUMMARY OF THE INVENTION

The present invention provides reaction chamber cleaning apparatus comprising a chamber comprising a chamber wall comprising an interior surface; a blade apparatus comprising (i) at least one annular mounting member and (ii) at least three scraping blades attached peripherally about the annular mounting member and arranged in a parallel relationship to a longitudinal axis of the chamber; and a reciprocal movement unit for rotating said scraping blade(s) circumferentially back and forth along the interior surface of said chamber to scrape the interior surface of said chamber, wherein such reciprocable movement unit comprises a reciprocable member pivotally connected to an extension member, and the extension member is pivotally connected at a peripheral position to the blade apparatus.

The present invention also provides a vortex unit comprising: (i) a top plate comprising a top surface, a bottom surface and a central opening; (ii) a generally conical outer shell attached to and extending downwardly from the top plate top plate, in which the outer shell comprises an inner surface and a central opening that is generally aligned with the central opening of the top plate; (iii) a liquid inlet arranged in relation to the outer shell to tangentially introduce liquid into the outer shell, thereby forming a laminar sheet of fluid on the inner surface of the outer shell; (iv) a baffle attached to the lower surface of the top plate and extending generally vertically downwardly therefrom, in which the baffle comprises an inner surface, an outer surface, a bottom edge, and a central opening generally concentrically aligned with the central opening of the outer shell; (v) a concentric chamber bounded by the outer surface of the baffle, the inner surface of the outer shell, and the bottom surface of the top plate; and (vi) a concentric opening formed between the bottom edge of the baffle and the inner surface of the outer shell.

The reaction chamber cleaning apparatus and the vortex unit are suitably combined into a unitary assembly as a single article of manufacture.

In one aspect, the baffle of the vortex unit is arranged to provide a flow restriction so that during operation of the self-cleaning chamber mechanism, the concentric chamber is completely filled with liquid. The water vortex unit may also comprise a flange that accommodates attachment of the reaction chamber cleaning apparatus.

In one aspect, the liquid inlet is in fluid connection with a source of water. In another aspect, the reaction chamber cleaning apparatus of claim also comprises an exhaust moisture control system arranged to pass dry air through the chamber to a secondary scrubbing tower.

The reaction chamber cleaning apparatus may be incorporated into an effluent abatement system by positioning the.apparatus in downstream fluid flow communication with an effluent source such as a chemical vapor deposition apparatus or a semiconductor manufacturing apparatus.

In one aspect of the present invention, the blades of the reactor chamber cleaning apparatus are double-edged. Moreover, the blades preferably have a width and the reciprocating member has a range of movement, which width and range of movement are selected to provide each blade with a rotational path which overlaps with the rotational path of another blade. The blades are preferably from about 0.65 to about 0.75 inches wide, more preferably about 0.70 inches wide, and the rotation range is about 90°.

In another aspect, the reciprocable member of the reactor chamber cleaning apparatus is a piston of an air cylinder. The air cylinder is preferably equipped with a mechanism for indicating whether the cylinder is sufficiently extending and/or retracting to ensure that the apparatus is properly cleaning the chamber. For example, the mechanism may comprise one or more appropriately positioned magnetic reed switches. The mechanism for indicating whether the cylinder is sufficiently extending and retracting is preferably configured to provide an output, such as an electronic signal, indicative of whether the cylinder is sufficiently extending and/or retracting. The electronic signal may be transmitted to a CPU for further processing and/or may trigger an alarm, such as an audible alarm to indicate that the cylinder is not sufficiently extending and/or retracting.

The present invention also provides a method for using the apparatus of the invention for abating an effluent. The method generally comprises the steps of flowing liquid into the inlet so as to fill the concentric chamber with liquid and form a laminar sheet of liquid on the inner surface of the outer shell and flowing effluent into the chamber for abatement.

Other aspects, features and embodiments of the invention will be more fully apparent from the ensuing disclosure and appended claims.

3. BRIEF DESCRIPTION OF THE DRAWINGS

4. DETAILED DESCRIPTION OF THE INVENTION

Figure 1:
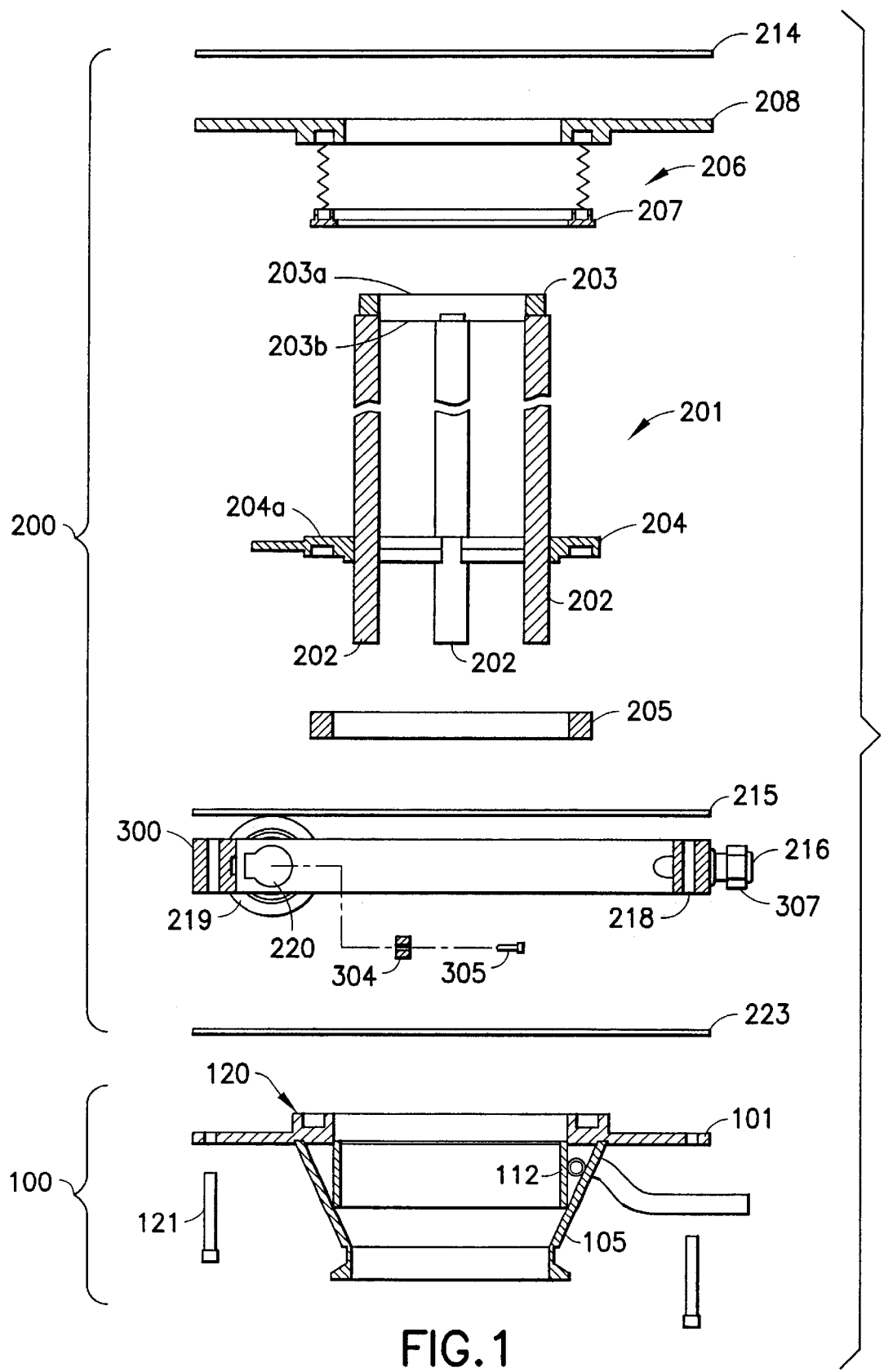
FIG. 1 shows an exploded view of an embodiment of the RCCM/vortex of the present invention.

The present invention provides a new and improved RCCM and a new and improved water vortex. The RCCM and vortex aspects of the invention are suitably combined into one unit. FIG. 1 shows an expanded view of a combined RCCM/vortex apparatus of the present invention, including the water vortex unit 100 and the RCCM unit 200.

4.1 Water Vortex Unit

Figure 2:
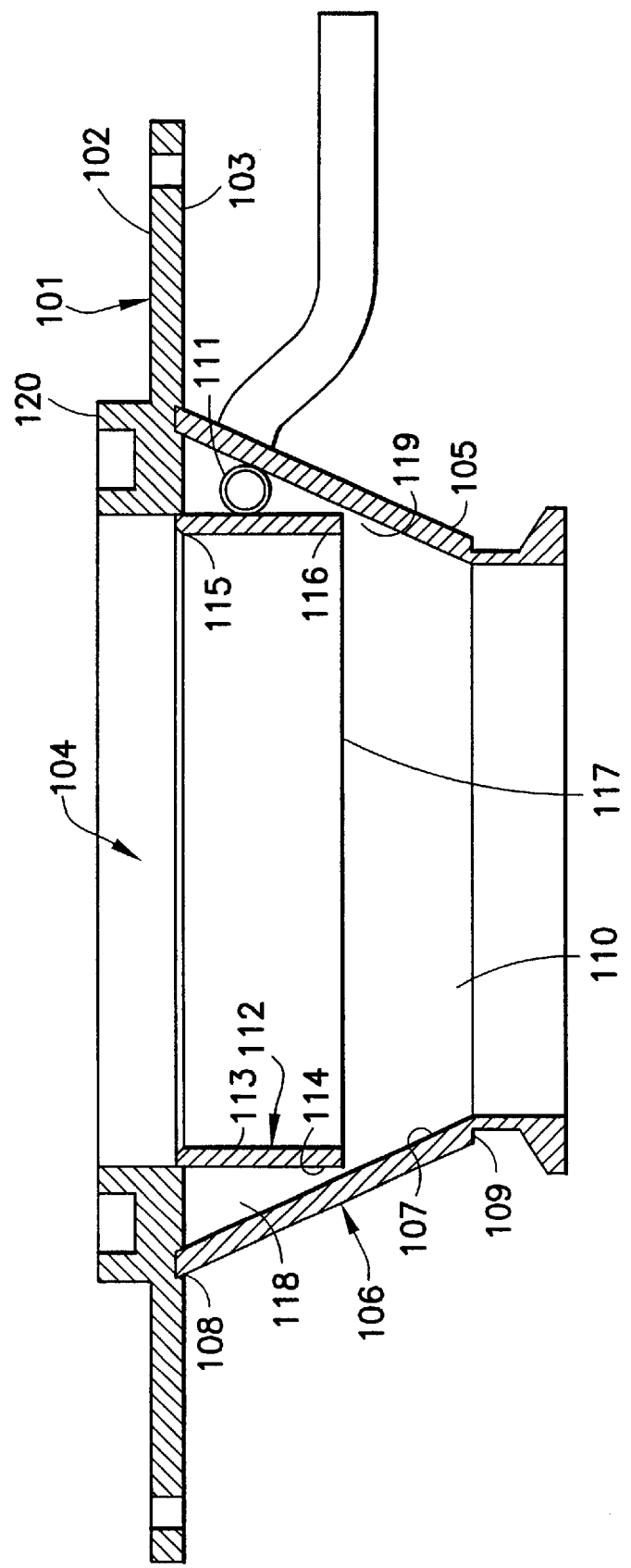
FIG. 2 shows enlarged view of an embodiment of the vortex of the present invention.

FIG. 2 shows an enlarged view of the water vortex unit 100. The water vortex unit generally comprises a top plate 101, a generally cone-shaped outer shell 105 and a baffle 112.

The top plate 101 comprises a top surface 102, a bottom surface 103 and a central opening 104.

The outer shell 105 comprises an outer surface 106, an inner surface 107, a top edge 108, a bottom edge 109 and a central opening 110 which is generally aligned with the central opening 104 of the top plate 101. The top edge 108 of the outer shell 105 is attached to and extends downwardly from the top plate 101. The diameter of the central opening 110 of the outer shell 105 narrows as the distance from the top plate 101 increases, thus providing the outer shell 105 with a cone-like shape. The outer shell 105 may be attached to the top plate may be by any means known in the art, including for example, welding, screws, bolts or other mechanical fasteners, compression and/or other means of fixation. Alternatively, the top plate and the outer shell may be molded as a unitary article.

The outer shell 105 comprises a liquid inlet 111. The liquid inlet 111 is arranged in relation to the outer shell 105 such that as liquid is introduced tangentially into the outer shell 105 a laminar sheet of fluid (not shown) is formed on the inner surface 107 of the outer shell 105. The liquid inlet 111 is in fluid connection with a fluid source (not shown). The preferred fluid is water. The laminar sheet of water circles around and completely covers the inner surface 107 of the outer shell.

The water vortex unit 100 also comprises a baffle 112 attached to the top plate 101 and extending generally vertically downwardly therefrom. The baffle 112 has an inner surface 113, an outer surface 114, a top edge 115, a bottom edge 116 and a central opening 117. The baffle 112 is attached such that the central opening 117 is generally concentrically aligned with the central opening 110 of the outer shell 105 and the central opening 104 of the top plate 101. The baffle 112 may be attached to the top plate 101 inside the diameter of the central opening 104 of the top plate 101 as specifically shown in FIG. 2. Moreover, the central openings of the top plate 101 and the baffle 112 may be coextensive, essentially forming a single central opening through the top plate 101 and the baffle.

A concentric chamber 118 is bounded by the outer surface 114 of the baffle 112, the inner surface 107 of the outer shell 105 and the bottom surface 103 of the top plate 101. The concentric chamber has a concentric opening 119 between the bottom edge 116 of the baffle 112 and the inner surface 107 of the outer shell 105.

The baffle 112 is arranged to provide a flow restriction which ensures that the concentric chamber 118 is substantially or completely filled with liquid. This arrangement prevents corrosive gases from entering the concentric chamber 118, prevents splashing, and aids in making the water flow laminar.

The water vortex unit 100 preferably comprises a flange 120 which accommodates the bushing 205 for the RCCM.

4.2 RCCM Unit

FIG. 1 shows an exploded view of the RCCM/vortex apparatus of the present invention, including an exploded view of the RCCM unit 200. The RCCM unit 200 is enclosed in the RCCM housing 300 (shown in FIG. 1). The RCCM unit comprises a blade assembly 201. The blade assembly 201 comprises 1 or more, preferably 2 to 6, more preferably 3, 4 or 5, and most preferably 4 blades 202 attached by welding or other attachment means known in the art to at least an upper ring 203 and a lower ring 204. The blades 202 are preferably double-edged blades. The apparatus of the present invention provides, greater blade assembly strength. The failure mode of currently available blade assemblies is caused by insufficient torsional strength. Torsional strength is increased in the blade assembly of the present invention by increasing the number of blades.

The blade assembly 201 is suitably arranged to pivot on a bushing 205, .which is attached to the water vortex unit 100. The blade assembly 201 is preferably designed to press fit into the water vortex unit and is suitably held in place by a spring loaded thrust bearing unit 206. The liquid flowing through the liquid vortex 100 cools the bushing 205 without allowing water to enter the RCCM housing 300 (shown in FIG. 1). The spring-loaded thrust bearing accommodates manufacturing tolerance build up.

The thrust bearing unit 206 preferably has a maximum vertical range of motion of about 0.01 to about 0.05 inches, more preferably about 0.02 to about 0.04 inches, and most preferably about 0.03 inches, to account for tolerance build up and to prevent process gas from entering the RCCM housing 300.

Figure 3:
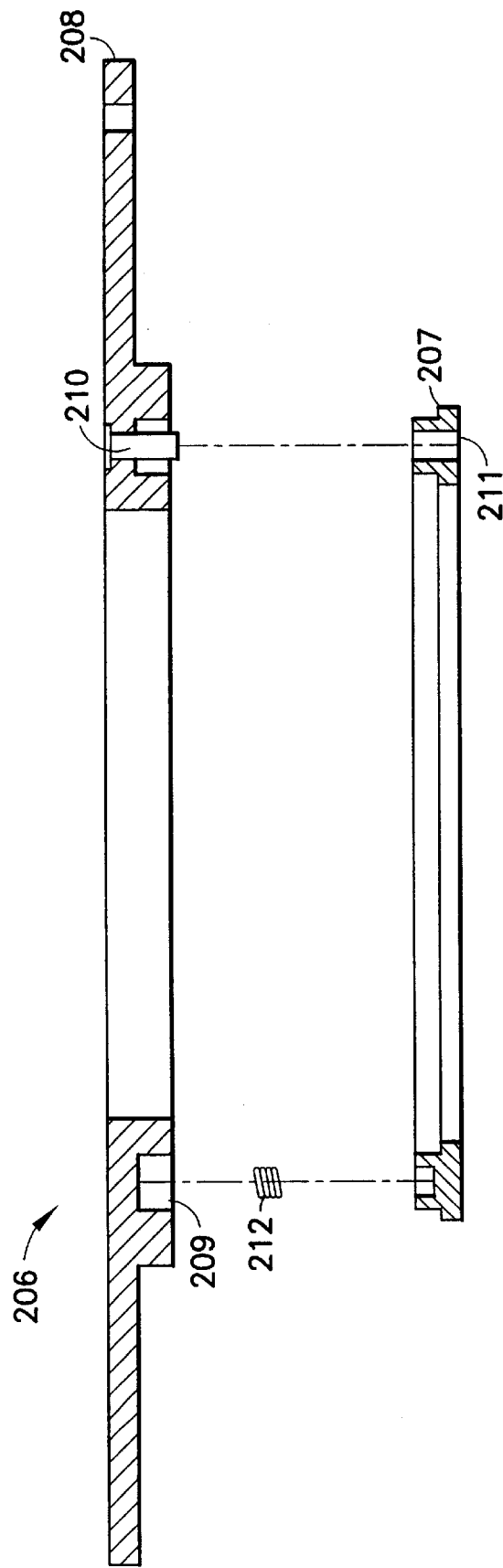
FIG. 3 shows an embodiment of the thrust bearing unit of the present invention.

Referring now to FIG. 3, the thrust bearing unit 206 comprises a thrust bearing 207 and a top plate 208. The thrust bearing 207 rides in a circular groove 209 cut into the top plate 208. The top plate 208 also suitably comprises pins 210 that mate with holes 211 in the thrust bearing 207 to prevent it from rotating. The holes 211 in the thrust bearing 207 are constructed and arranged to receive the pins 210 of the top plate 208. The thrust bearing 207 is constrained to linear motion to prevent wear on springs 212 that are arranged in a pushing relationship between the top plate 208 and the thrust bearing 207 to force the thrust bearing towards the top surface of the lower ring 204 of the RCCM blade assembly 201 to keep the thrust bearing 207 in contact with the top surface 204A of the lower ring 204 of the RCCM blade assembly 201.

Figure 5:
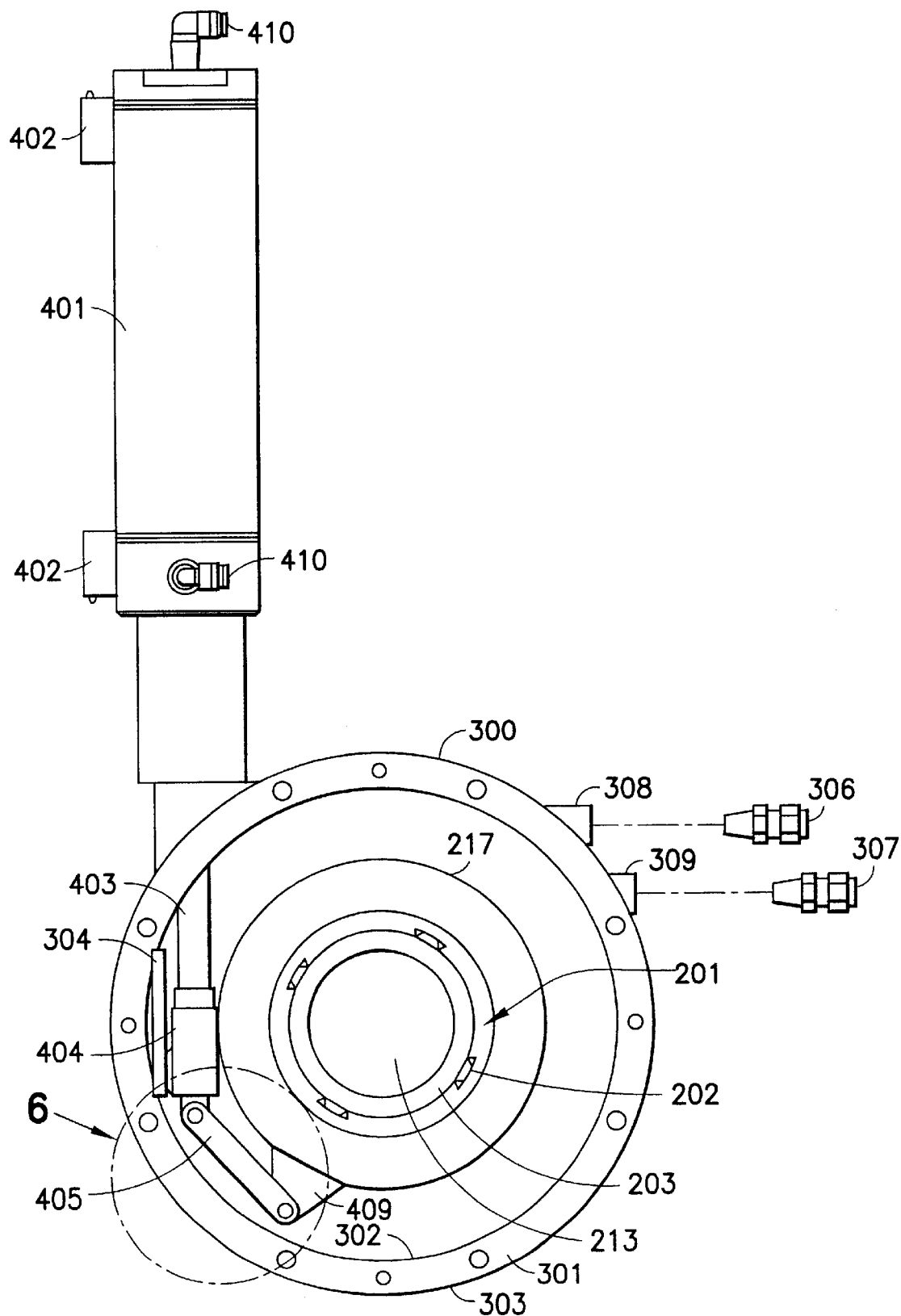
FIG. 5 shows a top cross-sectional view of the RCCM/vortex apparatus of the present invention.

Referring now to FIG. 5, the RCCM unit is preferably contained in a housing 300. The housing is preferably manufactured from aluminum for ease of manufacture, weight minimization, ease of maintenance, and heat transfer. The housing also preferably comprises an inlet port 308 and an outlet port 309 to prevent the introduction of fluid components into the interior of the housing 300. The inlet port and the outlet port are suitably employed for the introduction of clean dry air (CDA) for exhaust moisture suppression. The fitting 307 of the outlet port is shown in FIG. 1. The introduction of CDA also assists in cooling the drive components and doubles as an air purge to prevent process gases from entering the RCCM drive mechanism.

Figure 4A:
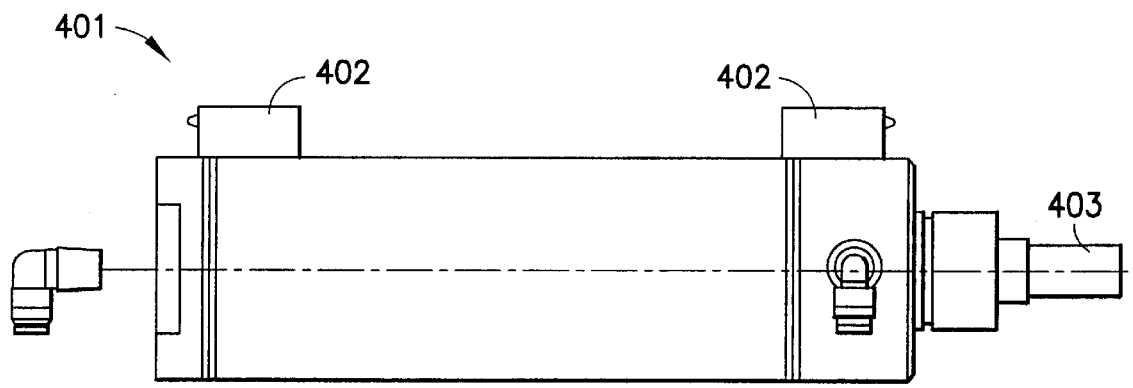
FIG. 4A shows an embodiment of the air cylinder component of the invention.
Figure 4B:
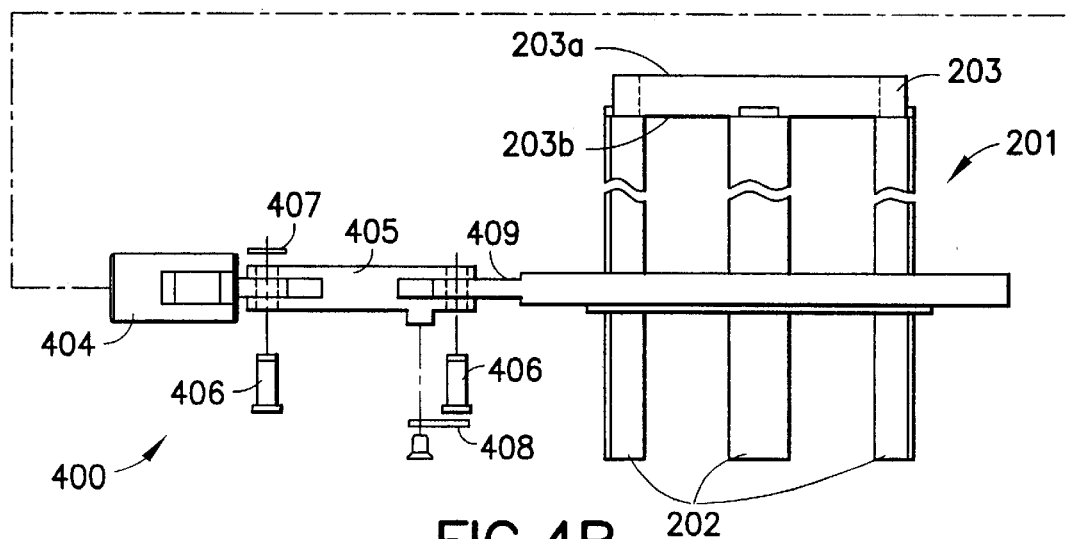
FIG. 4B shows an exploded section of and embodiment of the drive assembly of the apparatus of the invention.

The RCCM apparatus of the present invention suitably comprises a drive mechanism 400 (see FIG. 4B) comprising an air cylinder 401 (see FIG. 4A). The drive mechanism operates without the necessity of springs, gears, or push rod assembly. This advance over the presently existing cleaning mechanisms is enabled by directly linking the air actuator to the blade assembly.

Referring now to FIG. 4A, the air cylinder 401 is preferably capable of generating at least 400 lbs. of force with a source pressure of 80 psi. The air cylinder 401 is suitably equipped with a mechanism for indicating whether the cylinder is making complete strokes. Such mechanism suitably comprises magnetic reed switches 402.

Figure 6:
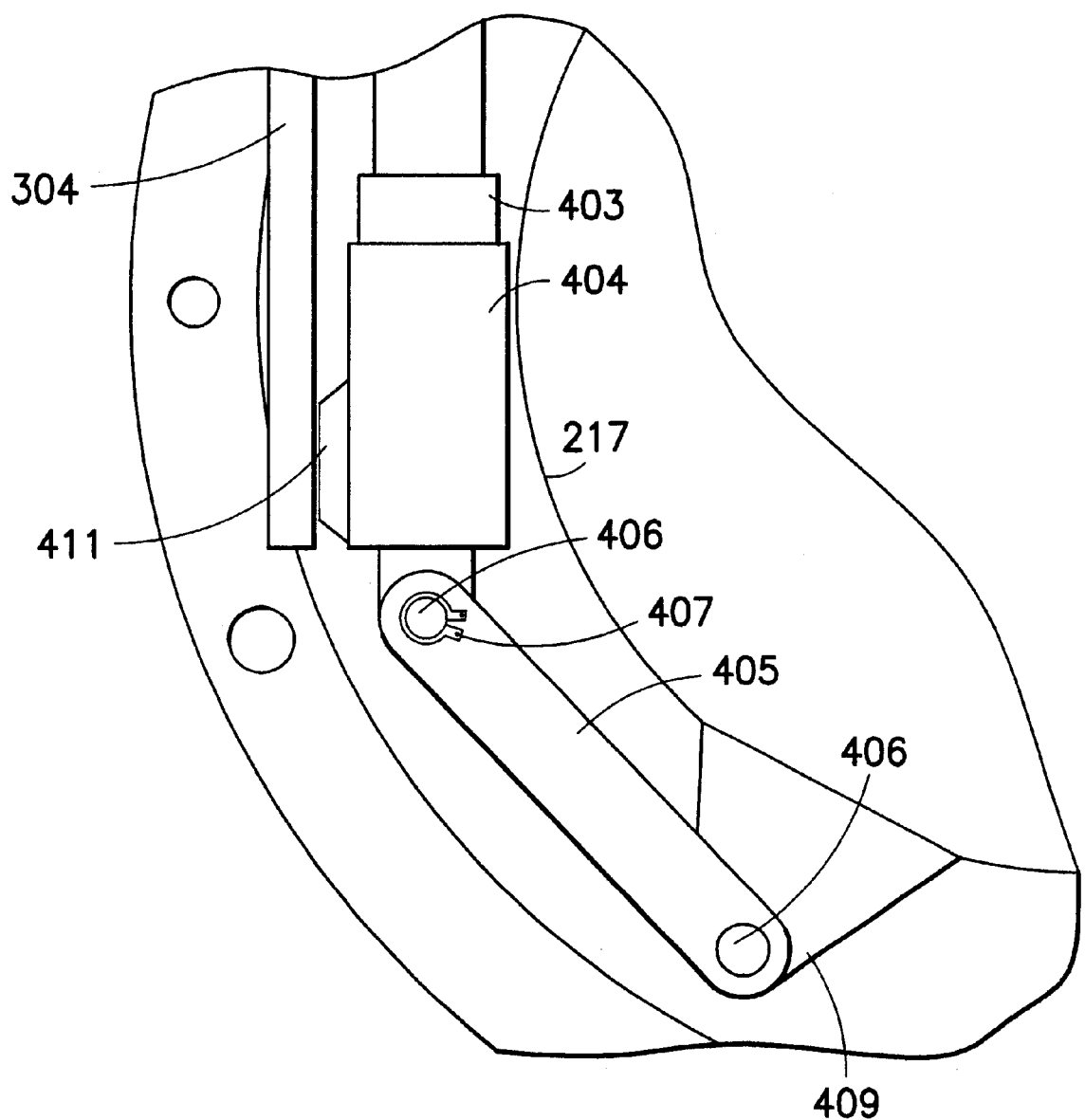
FIG. 6 shows an enlarged section of FIG. 5 showing aspects of the drive mechanism of the present invention.
Figure 7:
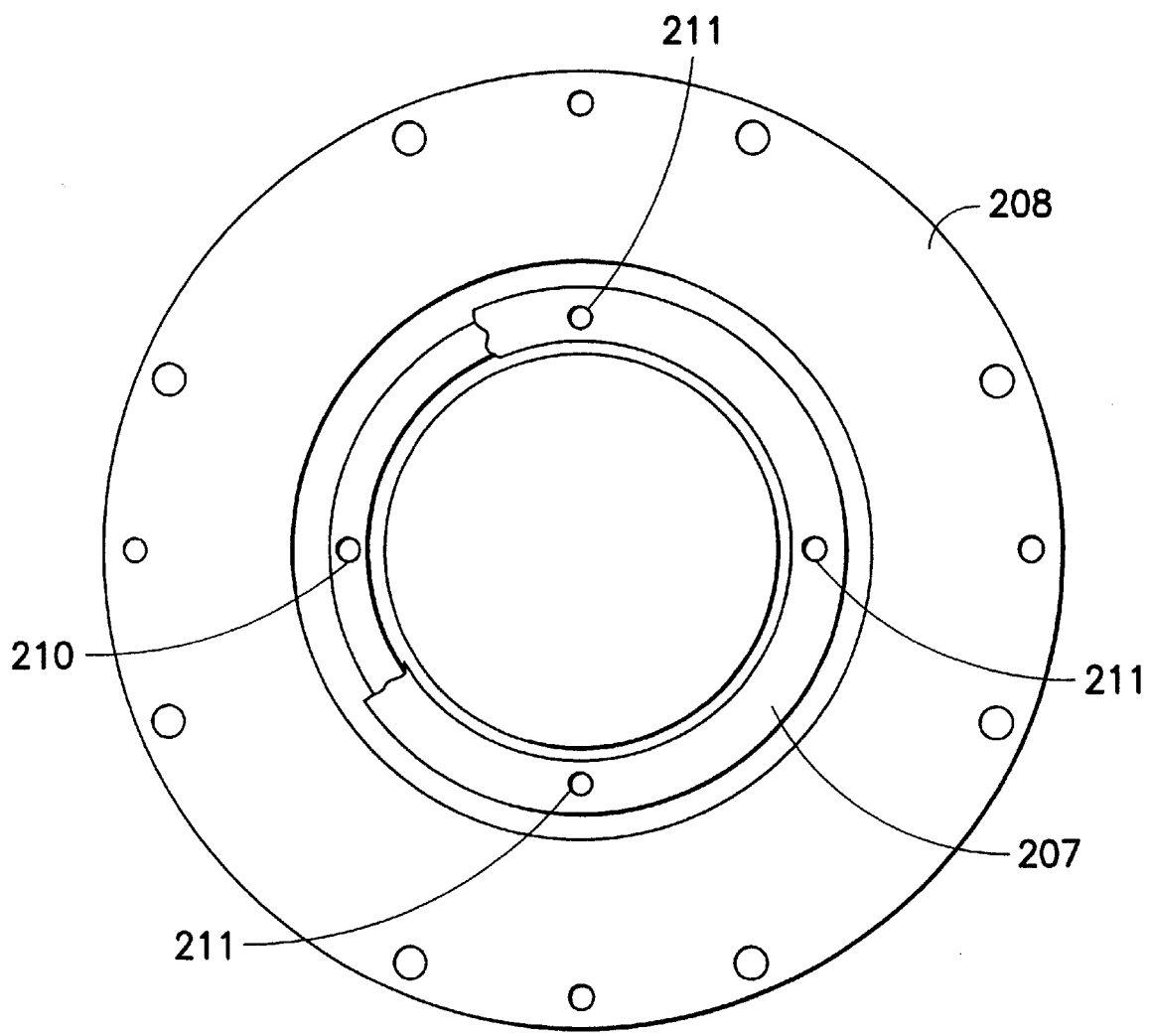
FIG. 7 shows a cut-away view of the thrust bearing in the top plate of the thrust bearing unit.

Referring now to FIG. 6, the air cylinder 401 comprises a piston rod 403 connected to a cylinder adapter 404. The means of attachment may be by any means known in the art; a suitable means is threading the piston rod 403 into the cylinder adapter 404. The cylinder adapter 404 is preferably attached to a rotating link 405 via pivot pin 406. The other end of the rotating link is preferably attached to the lower ring 204 of the blade assembly 201 via pivot pin 406. Unlike currently available RCCMs the apparatus of the present invention avoids the need for using 8–32 fasteners in the drive mechanism. The pivot pin 406 at the adapter 404 is preferably held in place with a snap ring 407. The pivot pin 406 at the blade assembly 201 is held in place with a retainer plate for case of disassembly in the field. The air cylinder 401 is threaded into the RCCM housing 300 as shown in FIG. 5 (in which the top and trust bushing are removed for clarity).

FIG. 5 also shows a guide plate 304 that is attached to the RCCM housing 300. The guide plate may be attached to the housing by any means known in the at, for example, the guide plate 304 is suitably attached by two mechanical fasteners 305 (see also FIGS. 1 and 6). The cylinder adapter 404 is preferably designed to slide along the guide plate 304 when the air cylinder 401 extends against a high load. Accordingly, the guideplate 304 is arranged in relation to the RCCM housing 300 and the cylinder adapter 404 so that the cylinder adapter 404 slides along the guide plate 304 when the air cylinder 401 extends against a high load When the air cylinder 401 retracts against a high load, the cylinder adapter 404 is designed to slide along the outside diameter .217 of the lower ring 204 of the blade assembly 201. The air cylinder piston rod 403 is thereby protected from excessive deflection or buckling, and the guide bushing (not shown) in the air cylinder 401 is protected from excessive wear. The guide plate 304 and bushing 205 are preferably designed to be removable rather than integral parts of other components so that they can be replaced with different materials if wear is excessive.

4.3 Operation of the RCCM Apparatus

Figure 8A:
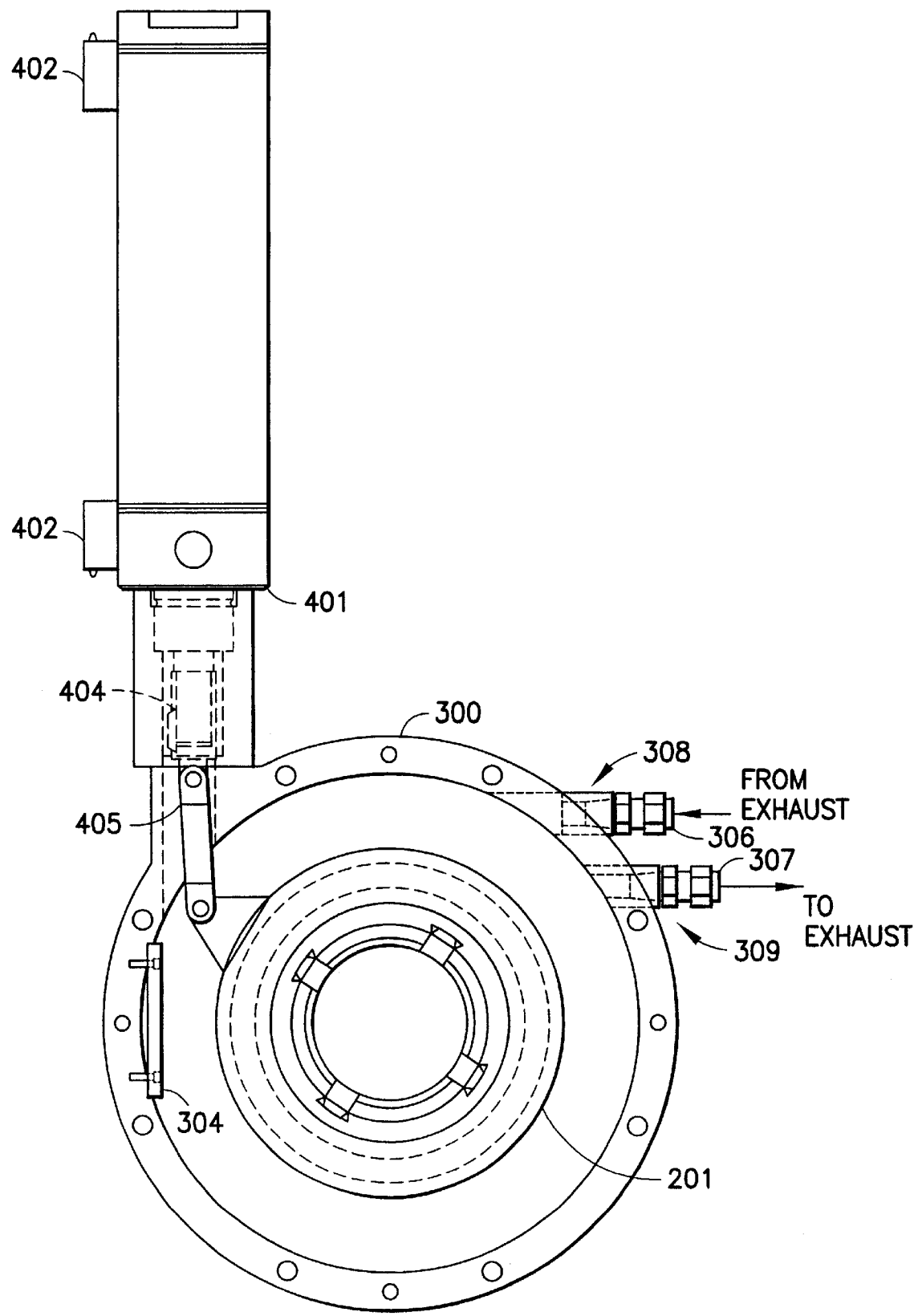
FIG. 8A shows plan view of the RCCM/Vortex with the air cylinder in its retracted position.
Figure 8B:
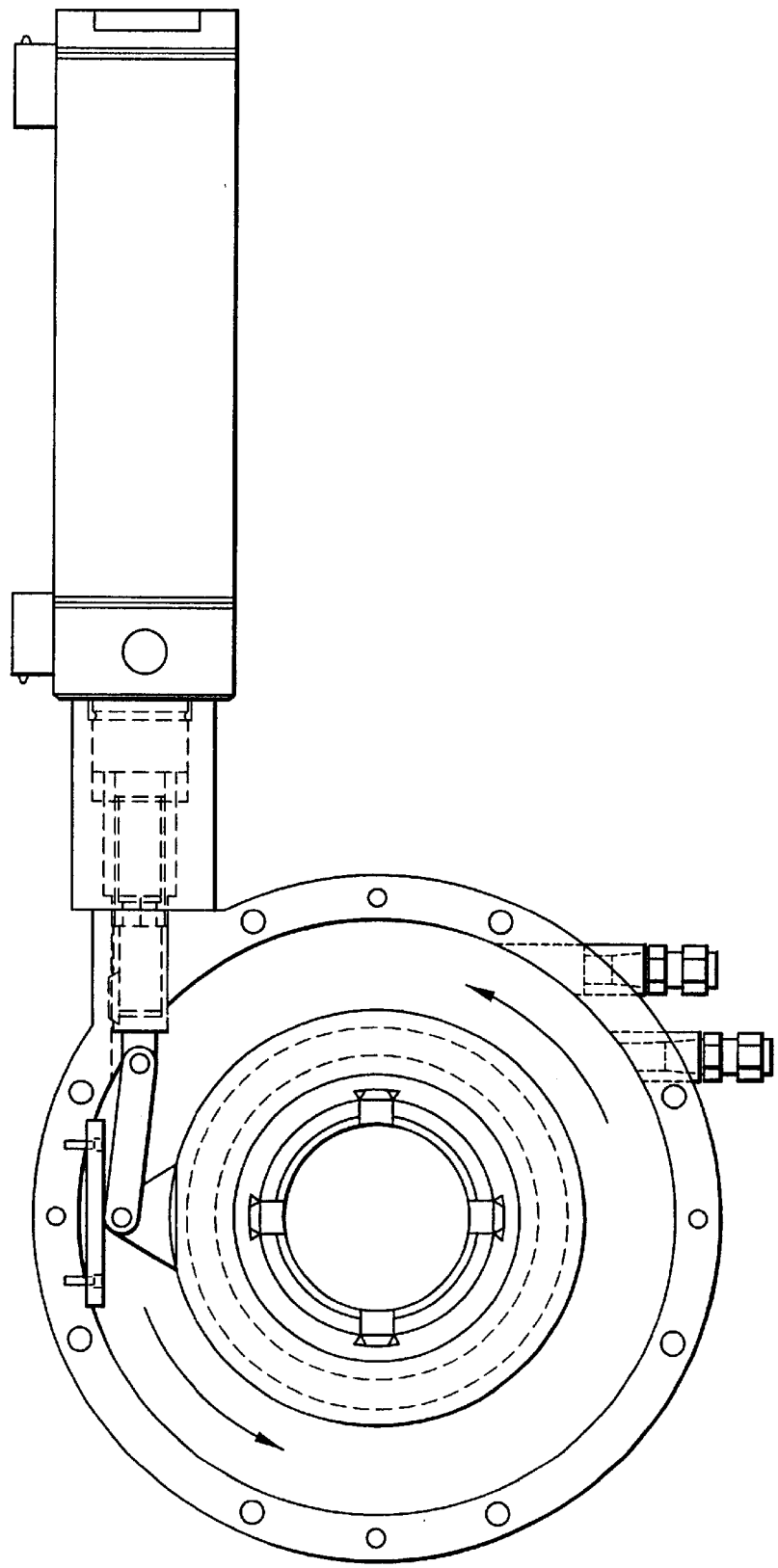
FIG. 8B shows the RCCM/Vortex apparatus of the present invention as the cylinder is extending.
Figure 8C:
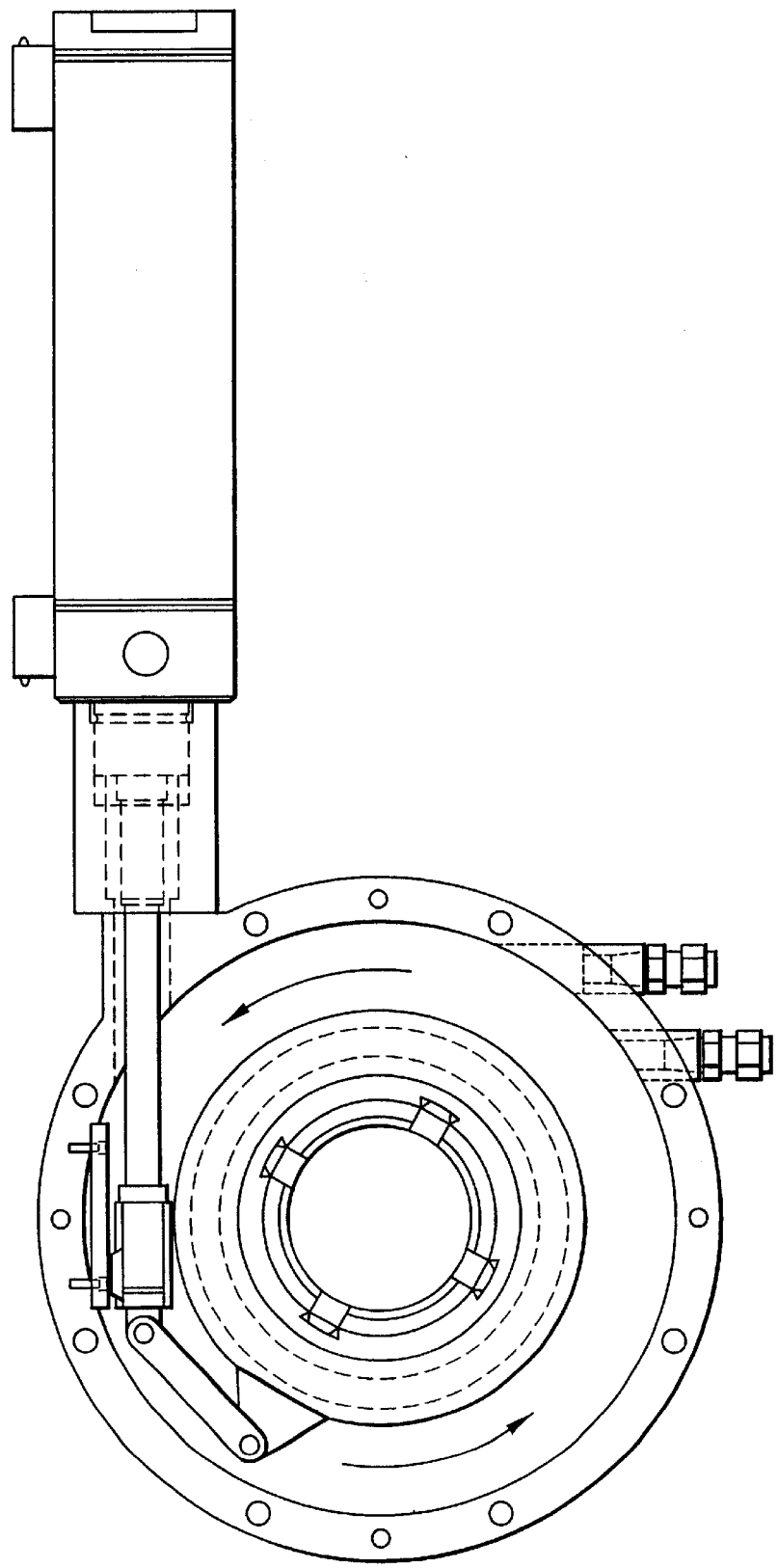
FIG. 8C shows the RCCM/Vortex with the air cylinder in its full-extended position.

The blade assembly 201 of the RCCM/Vortex rotates clockwise and counter clockwise with the extension and retraction (or vice versa) of the piston 403 of the air cylinder 401. The blades 202 are preferably double edged and clean in both the clockwise and counter clockwise directions. The blade width and rotation range are selected to provide overlap in the cleaning passes. For example, in a preferred aspect, the blades 202 are preferably from about 0.65 to 0.75 inches wide, more preferably 0.70 inches wide, and the rotation range is about 90°, thereby providing overlap in the cleaning passes. An air cylinder stroke actuates the cleaning motion; the stroke is suitably about 6 inches in length. The air cylinder 401 is linked to the blade assembly 201 via rotating link. FIG. 8A shows a plan view of the RCCM/Vortex with the air cylinder in its retracted position. FIG. 8B shows the RCCM/Vortex apparatus of the present invention as the cylinder 401 is extending. FIG. 8C shows the RCCM/Vortex with the air cylinder 401 in its full-extended position.

In a preferred embodiment, the cylinder 401 takes approximately 2–3 seconds (unobstructed, with solenoid throttles set to full open) to fully extend or fully retract. The timing circuit is set to apply pressure to extend and retract the air cylinder 401 for a time which is ample to permit the blade assembly 201 to cut through obstructions before changing directions. Thus, for example, the timing circuit is preferably set to apply pressure to extend the air cylinder 401 for about 10 seconds and retract the air cylinder 401 for about 10 seconds, thereby providing ample time for the RCCM blade assembly 201 to cut through obstructions before changing directions. The duration of pressure to extend and retract the air cylinder 401 can easily be altered to accommodate different field conditions by modifying the timing circuit program.

The RCCM blade assembly of the present invention cleans in both the counter-clockwise and clockwise directions, and is thereby more effective than currently available apparatuses at dislodging deposits in the reaction chamber.

Fluid flowing through the fluid vortex will cool the main bushing 205 about which the blade assembly 201 rotates. Air from the exhaust moisture control system will preferably make one pass through the RCCM housing 300 before entering an upper secondary scrubbing tower. This will provide additional RCCM component cooling and act as a purge for the RCCM housing 300.

The magnetic reed switches 402 located on the air cylinder 401 will indicate if the cylinder 401 is sufficiently extending and retracting, thereby providing a measure of the functioning of the apparatus, since the air cylinder 401 is positively linked to the blade assembly 201.

The present invention preferably incorporates both a fluid vortex unit 100 and an RCCM unit 200 in a single cleaning apparatus. This apparatus is preferably used in conjunction with a lower spray jet outside of the reaction chamber, thereby preventing lower reaction chamber corrosion and build-up caused by minerals in the water.

It is to be understood that the embodiment described above is merely illustrative of some of the many specific embodiments of the present invention, and that other arrangements will be readily apparent by one of ordinary skill in the art in light of the present disclosure without departing from the scope of the invention.

(b) a generally conical outer shell attached to and extending downwardly from the top plate, said outer shell comprising an inner surface and a central opening generally aligned with the central opening of the top plate; and (c) a baffle attached to the top plate and extending generally vertically downwardly from the top plate, said baffle comprising an inner surface, a bottom edge; and a central opening generally concentrically aligned with the central opening of the outer shell;

(d) a concentric chamber bounded by the outer surface of the baffle, the inner surface of the outer shell and the bottom surface of the top plate;

(e) a concentric opening formed between the bottom edge of the baffle and the inner surface of the outer shell; and (f) a liquid inlet arranged in relation to the outer shell to tangentially introduce liquid into the concentric chamber wherein the baffle is arranged to restrict the flow of liquid introduced into the concentric chamber, so that during operation of the liquid vortex apparatus, the concentric chamber is filled with liquid, and said liquid forms a laminar sheet of fluid on the inner surface of the outer shell as said fluid exits the concentric chamber via the concentric opening.

| List of Reference Numerals | | | |
|---|---|---|---|
| 100 | Water Vortex Unit | 200 | RCCM Unit |
| 101 | Top Plate | 201 | Blade Assembly |
| 102 | Top Surface of Top Plate 101 | 202 | Double Edged Blades |
| 103 | Lower Surface of Top Plate 101 | 203 | Upper Ring of Blade Assembly 201 |
| 104 | Opening in Top Plate 101 | 203a | Top Surface of Upper Ring 203 |
| 105 | Outer Shell | 203b | Bottom Surface of Upper Ring 203 |
| 106 | Outer Surface of Outer Shell 105 | 204 | Lower Ring of Blade Assembly 201 |
| 107 | Inner Surface of Outer Shell 105 | 205 | Bushing |
| 108 | Top Edge of Outer Shell 105 | 206 | Thrust Bearing Unit |
| 109 | Bottom Edge of Outer Shell 105 | 207 | Thrust Bearing of Bearing Unit 206 |
| 110 | Central Opening of Outer Shell 105 | 208 | Top Plate of Bearing Unit 206 |
| 111 | Water Inlet of Outer Shell 105 | 209 | Circular Groove Cut in Top Plate 208 |
| 112 | Baffle | 210 | Pins in Top Plate 208 |
| 113 | Inner Surface of Baffle 112 | 211 | Holes in Thrust Bearing 207 |
| 114 | Outer Surface of Baffle 112 | 212 | Springs of Bearing Unit 206 |
| 115 | Top Edge of Baffle 112 | 213 | Cylindrical Opening of RCCM Unit |
| 116 | Bottom Edge of Baffle 112 | 214 | Reaction Chamber Gasket |
| 117 | Central Opening of Baffle 112 | 215 | Upper Gasket for RCCM Housing 300 |
| 118 | Concentric chamber | 216 | Opening for Exhaust Moisture Control CDA Exit |
| 119 | Concentric Opening in Bottom of Concentric Chamber | 217 | Outside Diameter of Lower Ring 204 |
| 120 | Flange | 218 | Hole for RCCM/Vortex Assembly Bolts |
| 121 | RCCM/Vortex Assembly Bolts | 219 | Air Cylinder Boss |
| | | 220 | Opening for Air Cylinder Piston Rod 403 and Air Cylinder Adaptor 404 |
| | | 223 | Lower Gasket for RCCM Housing 300 |
| 300 | RCCM Housing | 400 | Drive Mechanism |
| 301 | Cylindrical Wall of RCCM Housing | 401 | Air Cylinder |
| 302 | Interior Surface of Cylindrical Wall 301 | 402 | Reed Switches |
| 303 | Exterior Surface of Cylindrical Wall 301 | 403 | Piston Rod |
| 304 | Guideplate | 404 | Air Cylinder Adaptor |
| 305 | Fasteners for Guideplate 304 | 405 | Rotating Link |
| 306 | Exhaust Moisture Control CDA Fitting | 406 | Pivot Pin |
| 307 | Exhaust Moisture Control CDA Fitting | 407 | Snap Ring |
| 308 | Exhaust Moisture Control CDA Inlet | 408 | Retainer Plate |
| 309 | Exhaust Moisture Control CDA Outlet | 409 | Lower Ring Lug |
| | | 410 | Air Cylinder Fitting |
| | | 411 | Sliding Support of Cylinder Adaptor 404 |

What is claimed is:

1. A liquid vortex apparatus comprising:

(a) a top plate comprising a top surface, a bottom surface and a central opening;

2. The liquid vortex apparatus of claim 1 wherein the baffle is attached to the inside diameter of the opening in the top plate.

3. The liquid vortex apparatus of claim 1 wherein the liquid vortex unit comprises a flange which accommodates attachment of a reaction chamber cleaning apparatus.

4. The liquid vortex apparatus of claim 1 wherein the liquid inlet is in fluid connection with a source of water.

5. A self cleaning chamber mechanism comprising:
   (a) a cylindrical chamber comprising cylindrical chamber wall comprising an interior passage bounded by an interior surface, and an inlet for introducing gaseous matter into the interior passage; and
   (b) the liquid vortex apparatus of claim 1 mounted to the cylindrical chamber such that the interior passage of the cylindrical chamber is in alignment with the central opening of the top plate, thereby permitting gaseous matter introduced into the interior passage of the cylindrical chamber to flow through the central opening of the top plate and into the vortex apparatus.

6. An effluent abatement system comprising the self-cleaning chamber mechanism of claim 5 downstream from an effluent source.

7. The effluent abatement system of claim 6 wherein the effluent source is a chemical vapor deposition apparatus.

8. The effluent abatement system of claim 6 wherein the effluent source is a semiconductor manufacturing apparatus.

9. A reaction chamber cleaning apparatus comprising:
   (a) a cylindrical chamber comprising a cylindrical chamber wall comprising an interior surface;
   (b) a blade apparatus comprising at least one annular mounting member and at least three scraping blades attached peripherally about the annular mounting member and arranged in a parallel relationship to a longitudinal axis of the cylindrical chamber; and
   (c) a reciprocal movement unit for rotating said scraping blade(s) circumferentially back and forth along the interior surface of said cylindrical chamber to scrape the interior surface of said cylindrical chamber, said reciprocable movement unit comprising a reciprocable member pivotally connected to an extension member, said extension member being pivotally connected at a peripheral position to the blade apparatus;
   (d) a liquid vortex apparatus in fluid connection with the interior passage, said liquid vortex apparatus comprising:
      (i) a top plate comprising a top surface, a bottom surface and a central opening;
      (ii) a generally conical outer shell attached to and extending downwardly from the top plate, said outer shell comprising an inner surface and a central opening generally aligned with the central opening of the top plate; and
      (iii) a baffle attached to the inside diameter of the opening in the top plate and extending generally vertically downwardly from the top plate, said baffle comprising an inner surface, a bottom edge, and a central opening generally concentrically aligned with the central opening of the outer shell;
      (iv) a concentric chamber bounded by the outer surface of the baffle, the inner surface of the outer shell and the bottom surface of the top plate;
      (v) a concentric opening formed between the bottom edge of the baffle and the inner surface of the outer shell; and
      (vi) a liquid inlet arranged in relation to the outer shell to tangentially introduce liquid into the concentric chamber and to thereby form a laminar sheet of fluid on the inner surface of the outer shell as said fluid exits the concentric chamber via the concentric opening.

10. The reaction chamber cleaning apparatus of claim 9 wherein the baffle is attached to the inside diameter of the opening in the top plate.

11. The reaction chamber cleaning apparatus of claim 9 wherein the baffle is arranged to provide a flow restriction so that during operation of the self-cleaning chamber mechanism, the concentric chamber is completely filled with liquid.

12. The reaction chamber cleaning apparatus of claim 9 wherein the water vortex unit comprises a flange which accommodates attachment of a scrubbing chamber.

13. The reaction chamber cleaning apparatus of claim 9 wherein the outer shell and the top plate are molded as a unitary article.

14. The reaction chamber cleaning apparatus of claim 9 wherein the outer shell and baffle are molded as a unitary article.

15. The reaction chamber cleaning apparatus of claim 9 wherein the liquid inlet is in fluid connection with a source of water.

16. The reaction chamber cleaning apparatus of claim 9 further comprising an exhaust moisture control system arranged to pass dry air through the cylindrical chamber to secondary scrubbing tower.

17. An effluent abatement system comprising the reaction chamber cleaning apparatus of claim 9 downstream from an effluent source.

18. The effluent abatement system of claim 17 wherein the effluent source is a chemical vapor deposition apparatus.

19. The effluent abatement system of claim 17 wherein the effluent source is a semiconductor manufacturing apparatus.

20. The reaction chamber cleaning apparatus of claim 9 wherein the blades are double-edged.

21. The reaction chamber cleaning apparatus of claim 20 wherein the blades have a width and the reciprocating member has a range of movement, which width and range of movement are selected to provide each blade with a rotational path which overlaps with the rotational path of an adjacent blade.

22. The reaction chamber cleaning apparatus of claim 20 wherein the blades from about 0.65 to about 0.75 inches wide and the rotation range is about 90°.

23. The reaction chamber cleaning apparatus of claim 9 wherein the reciprocable member is a piston of an air cylinder.

24. The reaction chamber cleaning apparatus of claim 23 wherein the air cylinder is equipped with magnetic reed switches arranged to indicate if the cylinder is sufficiently extending and retracting.

25. The reaction chamber cleaning apparatus of claim 9 wherein the air cylinder is equipped at least one detector for indicating whether the cylinder is sufficiently extending and retracting to ensure that the blades have a scraping path which substantially covers the interior surface of the cylindrical chamber wall of the cylindrical chamber.

26. The reaction chamber cleaning apparatus of claim 25 wherein the at least one detector is configured to provide an output indicative of whether the cylinder is sufficiently extending and retracting to ensure that the blades have a scraping path which substantially covers the interior surface of the cylindrical chamber wall of the cylindrical chamber.

27. The reaction chamber cleaning apparatus of claim 25 wherein the at least one detector comprises one or more magnetic reed switches arranged to indicate if the cylinder is sufficiently extending and retracting to ensure that the blades have a scraping path which substantially covers the interior surface of the cylindrical chamber wall of the cylindrical chamber.

28. The reaction chamber cleaning apparatus of claim 23 wherein the piston has a stroke length which is from about 5.5 to about 6.5 inches.

29. A method for cleaning an effluent gas comprising:
(a) providing a reaction chamber cleaning apparatus comprising:
  (i) a housing chamber comprising an effluent inlet and outlet and a chamber wall comprising an interior surface;
  (ii) a blade apparatus comprising at least one annular mounting member, at least four scraping blades attached peripherally about the annular mounting member and arranged in a parallel relationship to a longitudinal axis of the housing chamber;
  (iii) a reciprocal movement unit for rotating said scraping blade(s) circumferentially back and forth along the interior surface of said housing chamber to scrape the interior surface of said housing chamber, said reciprocable movement unit comprising a reciprocable member pivotally connected to an extension member, said extension member being pivotally connected at a peripheral position thereof to the blade apparatus;
  (iv) a vortex unit attached in fluid communication with the outlet of the housing chamber, said vortex unit comprising a top plate comprising a top surface, a bottom surface and a central opening, said vortex unit further comprising a generally conical outer shell attached to and extending downwardly from the top plate, said outer shell comprising an inner surface and a central opening which is generally aligned with the central opening of the top plate, and said vortex unit further comprising a baffle attached to the top plate and extending generally vertically downwardly therefrom said baffle comprising an inner surface, an outer surface, a bottom edge, and a central opening generally concentrically aligned with the central opening of the outer shell;
  (v) a concentric chamber bounded by the outer surface of the baffle, the inner surface of the outer shell, and the bottom surface of the top plate; and
  (vi) a liquid inlet arranged to tangentially introduce liquid into the concentric chamber, thereby filling the concentric chamber with liquid and forming a laminar sheet of fluid on the inner surface of the outer shell;
  (vii) a concentric opening formed between the bottom edge of the baffle and the inner surface of the outer shell;
(b) flowing liquid into the inlet so as to fill the concentric chamber with liquid and form a laminar sheet of liquid on the inner surface of the outer shell;
(c) flowing effluent into the housing chamber for abatement.

30. The method of claim 29 wherein the baffle is attached to the inside diameter of the opening in the top plate.

31. The method of claim 29 wherein the baffle is arranged to provide a flow restriction so that during operation of the reaction chamber cleaning apparatus, the concentric chamber is completely filled with liquid.

32. The method of claim 29 wherein the top plate of the water vortex unit comprises a flange which accommodates attachment of the housing chamber.

33. The method of claim 29 wherein the liquid inlet is in fluid connection with a source of water.

34. The method of claim 29 wherein the reaction chamber cleaning apparatus further comprises an exhaust moisture control system arranged to pass dry air through the chamber to secondary scrubbing tower.

35. The method of claim 29 wherein the effluent is introduced from a chemical vapor deposition apparatus.

36. The method of claim 29 wherein the effluent is introduced from a semiconductor manufacturing apparatus.

37. The method of claim 29 wherein the effluent is introduced from wherein the blades are double-edged.

38. The method of claim 37 wherein the blades have a width and the reciprocating member has a range of movement, which width and range of movement are selected to provide each blade with a rotational path which overlaps with the rotational path of another blade.

39. The method of claim 38 wherein the blades are from about 0.65 to about 0.75 inches wide and the rotation range is about 90°.

40. The method of claim 29 wherein the reciprocable member is a piston of an air cylinder.

41. The method of claim 38 wherein the air cylinder is equipped with at least one detector for indicating whether the cylinder have a scraping path which substantially covers the interior surface of the chamber wall of the housing chamber.

42. The method of claim 41 wherein the at least one detector is configured to provide an output have a scraping path which substantially covers the interior surface of the chamber wall of the housing chamber.

43. The method of claim 41 wherein the at least one detector comprises one or more magnetic have a scraping path which substantially covers the interior surface of the chamber wall of the housing chamber.

44. The method of claim 42 further comprising the step of stopping the flow of effluent through the housing chamber when the output indicates that the cylinder is not sufficiently extending and retracting.

45. The method of claim 44, wherein the stopping step is automated.

* * * * *